(12) United States Patent
Torisaki et al.

(10) Patent No.: US 7,913,316 B2
(45) Date of Patent: Mar. 22, 2011

(54) SEMICONDUCTOR INTEGRATED CIRCUIT AND METHOD FOR TESTING SEMICONDUCTOR INTEGRATED CIRCUIT

(75) Inventors: Yuishi Torisaki, Hyogo (JP); Makoto Fujiwara, Kyoto (JP); Yusuke Nemoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 1078 days.

(21) Appl. No.: 11/703,719

(22) Filed: Feb. 8, 2007

(65) Prior Publication Data

US 2007/0234138 A1    Oct. 4, 2007

(30) Foreign Application Priority Data

Feb. 10, 2006    (JP) .................................. 2006-033742

(51) Int. Cl.
*G06F 11/00* (2006.01)
(52) U.S. Cl. ..................... 726/34; 713/1; 713/2; 380/2
(58) Field of Classification Search .................. 713/1, 2; 726/34; 380/2; 714/7
See application file for complete search history.

(56) References Cited

U.S. PATENT DOCUMENTS

| | | | |
|---|---|---|---|
| 5,933,620 A | | 8/1999 | Lee et al. |
| 6,607,136 B1 * | | 8/2003 | Atsmon et al. ................. 235/492 |
| 7,184,545 B2 * | | 2/2007 | Fujiwara ........................... 380/2 |

FOREIGN PATENT DOCUMENTS

| | | |
|---|---|---|
| JP | 11-016392 | 1/1999 |
| JP | 2001-344992 | 12/2001 |
| JP | 2003-303500 | 10/2003 |

OTHER PUBLICATIONS

Japanese Notice of Reasons for Rejection, w/ English translation thereof, issued in Japanese Patent Application No. JP 2006-033742 dated Mar. 16, 2010.
Japanese Office Action, with English translation, issued in Japanese Patent Application No. 2006-033742, mailed Jun. 8, 2010.

* cited by examiner

*Primary Examiner* — Emmanuel L Moise
*Assistant Examiner* — Paul Callahan
(74) *Attorney, Agent, or Firm* — McDermott Will & Emery LLP

(57) ABSTRACT

A check computation circuit executes a computation corresponding to a computation for generating confidential CRC data, with respect to confidential data read from a non-volatile device. A comparison circuit compares the result of the computation in the check computation circuit with confidential CRC data read from the non-volatile device. When the result of the comparison indicates a mismatch, i.e., an error is detected, an encryption circuit encrypts the confidential data and the confidential CRC data using a secret key registered in a secret key register, and outputs the encrypted confidential data and confidential CRC data to the outside of a semiconductor integrated circuit.

11 Claims, 4 Drawing Sheets

SEMICONDUCTOR INTEGRATED CIRCUIT AND METHOD FOR TESTING SEMICONDUCTOR INTEGRATED CIRCUIT

CROSS REFERENCE TO RELATED APPLICATIONS

This Non-provisional application claims priority under 35 U.S.C. §119(a) on Patent Application No. 2006-33742 filed in Japan on Feb. 10, 2006, the entire contents of which are hereby incorporated by reference.

BACKGROUND OF THE INVENTION

1. Field of the Invention

The present invention relates to a semiconductor integrated circuit including a non-volatile device, and more particularly, to a technique for testing the non-volatile device.

2. Description of the Related Art

As a technique for testing a non-volatile device storing confidential information which is included in a semiconductor integrated circuit, there is a known technique in which confidential data stored in a ROM is subjected to a predetermined computation, such as cyclic redundancy check (CRC) or the like, the result of the computation is compared with redundant data for checking (hereinafter referred to as check redundant data) which is the result of a predetermined computation which is previously executed with respect to the confidential data, and the result (match or mismatch) of the comparison is output to the outside (see Japanese Unexamined Patent Application Publication No. 2001-344992). With the technique, the ROM can be tested without outputting the confidential information stored in the ROM to the outside.

However, in the conventional technique, even if an error is found, it cannot be determined whether the error is of the confidential data in the non-volatile device or of the check redundant data. Also, since a bit in which the error occurs cannot be detected, it is difficult to analyze a factor in the error.

SUMMARY OF THE INVENTION

An object of the present invention is to provide a semiconductor including a non-volatile device in which a test can be executed on the non-volatile device and a position of occurrence of an error can be specified while maintaining the confidentiality of confidential information stored in the non-volatile device.

Specifically, a first aspect of the present invention is directed to a semiconductor integrated circuit including a non-volatile device for storing confidential data, in which the non-volatile device is configured so that stored data cannot be read out to the outside of the semiconductor integrated circuit. The semiconductor integrated circuit comprises a redundant data storing section for storing check redundant data obtained by subjecting the confidential data to a predetermined computation, and a test circuit for executing a test on the non-volatile device using the check redundant data stored in the redundant data storing section. The test circuit comprises a check computation circuit for executing a computation corresponding to the predetermined computation with respect to the confidential data read from the non-volatile device, a comparison circuit for comparing a result of the computation in the check computation circuit with the check redundant data stored in the redundant data storing section, and an encryption circuit for encrypting the confidential data and the check redundant data using a predetermined secret key. When a mismatch between the computation result and the check redundant data is detected as a result of the comparison in the comparison circuit, a result of the encryption in the encryption circuit is output to the outside of the semiconductor integrated circuit.

According to the first aspect of the present invention, when a mismatch between the computation result of the check computation circuit and the check redundant data is detected, the encryption result (i.e., the confidential data and check redundant data encrypted using the predetermined secret key) is output to the outside of the semiconductor integrated circuit. Therefore, by decrypting the confidential data and check redundant data thus encrypted and output, using the predetermined secret key, and comparing the result of the decrypting with correct data to be stored in the non-volatile device, it is possible to specify a position of occurrence of an error. In this case, the confidential data and the check redundant data are encrypted and output. Therefore, an authorized tester who has the predetermined secret key can recover the original confidential data and check redundant data. Thus, an unauthorized user cannot obtain the confidential data and the check redundant data. Therefore, the confidentiality of the confidential data is maintained. Even if the confidential data is revealed by an unauthorized user, the confidential data includes an error, so that damage can be limited to a minor level. Therefore, it is possible to specify the position of occurrence of an error while maintaining the confidentiality of confidential data.

In the present invention of the first aspect, the redundant data storing section in the semiconductor integrated circuit is preferably the non-volatile device. The check redundant data is preferably stored at addresses different from those of the confidential data in the non-volatile device. Alternatively, the check redundant data is preferably stored at the same addresses as those of the confidential data in the non-volatile device.

In the present invention of the first aspect, the encryption circuit of the semiconductor integrated circuit encrypts only the confidential data using the predetermined secret key.

Thereby, it is possible to confirm the presence or absence of an error in the confidential data by decoding and checking the confidential data encrypted and output. When it is determined that there is not an error in the confidential data, an error is present in the check redundant data. In this case, since the check redundant data is not used when a test is not executed, the found data does not have a problem with the function of the semiconductor integrated circuit.

In the present invention of the first aspect, preferably, the test circuit of the semiconductor integrated circuit further comprises a secret key register for storing the predetermined secret key. Further, the test circuit preferably updates the predetermined secret key stored in the secret key register based on the check redundant data when a match between the computation result and the check redundant data is detected in the comparison circuit.

Thereby, different secret keys are used for encryption of the confidential data and the check redundant data, depending on the position of occurrence of an error. Therefore, it is possible to improve the confidentiality of output data.

Also, a predetermined initial value is preferably provided in the secret key register.

Thereby, when an error is found during the start of a test, it is possible to specify a secret key used in encryption of output data.

A second aspect of the present invention is directed to a method for testing a semiconductor integrated circuit including a non-volatile device for storing confidential data, in which the non-volatile device is configured so that stored data cannot be read out to the outside of the semiconductor integrated circuit. The method comprises the steps of previously storing check redundant data obtained by subjecting the confidential data to a predetermined computation into a redundant data storing section in the semiconductor integrated circuit, reading the confidential data from the non-volatile device, and executing a computation corresponding to the predetermined computation with respect to the read confidential data, reading the check redundant data from the redundant data storing section, and comparing a result of the computation with the read check redundant data, and encrypting the confidential data and the check redundant data using a predetermined secret key when a mismatch between the computation result and the check redundant data is detected as a result of the comparison.

As described above, according to the present invention, when an error is detected as a result of a test on a non-volatile device included in a semiconductor integrated circuit, encrypted confidential data and check redundant data or only the encrypted confidential data is output to the outside of the semiconductor integrated circuit. Therefore, it is possible to specify a position of occurrence of an error and analyze a cause of the error without impairing the confidentiality of the confidential data in the non-volatile device.

DETAILED DESCRIPTION OF THE PREFERRED EMBODIMENTS

Hereinafter, an embodiment of the present invention will be described with reference to the accompanying drawings.

Figure 1:
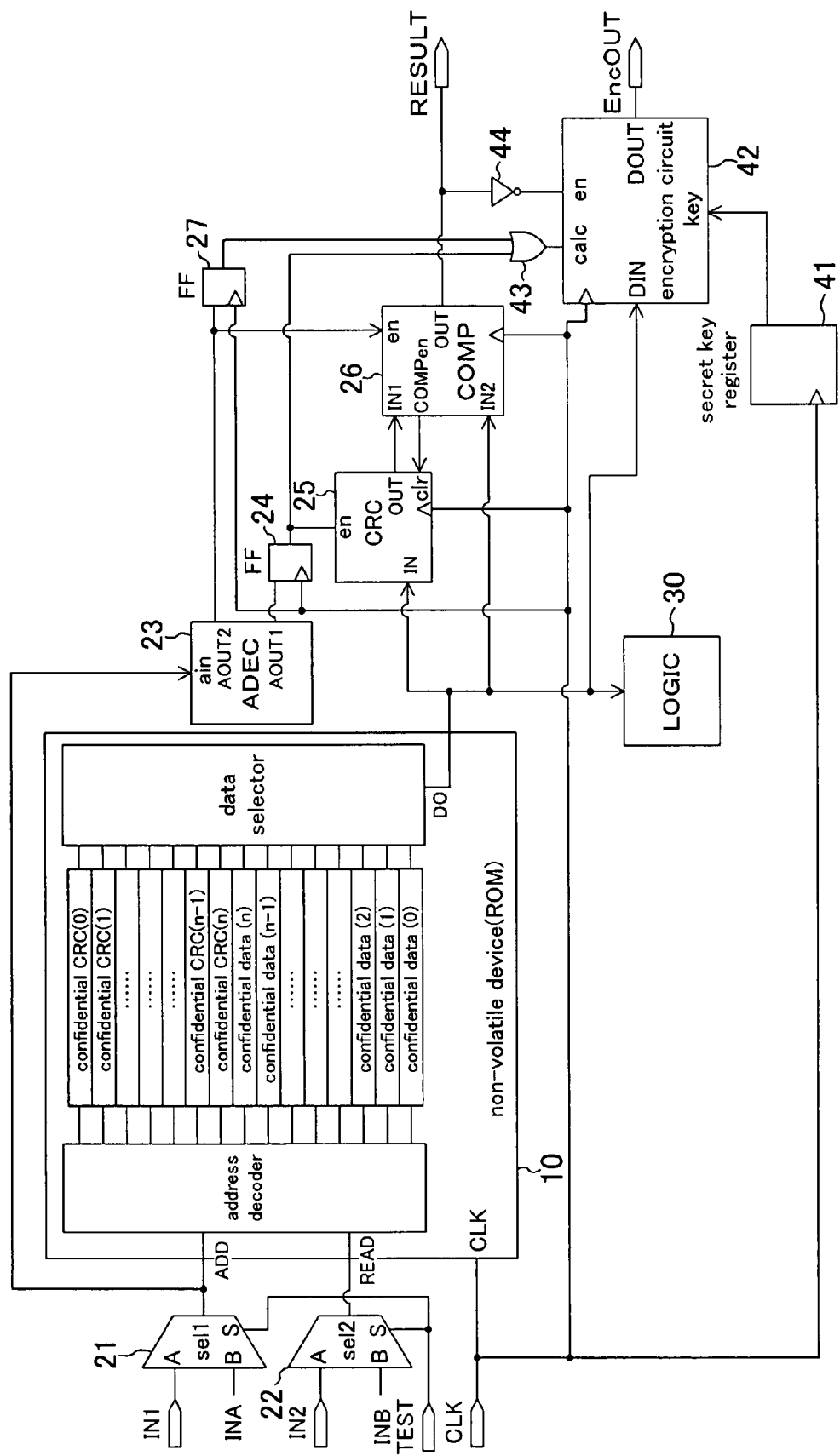
FIG. 1 is a block diagram illustrating a configuration of a semiconductor integrated circuit according to an embodiment of the present invention.

FIG. 1 is a block diagram illustrating a configuration of a semiconductor integrated circuit according to an embodiment of the present invention. In the semiconductor integrated circuit of FIG. 1, a ROM 10, which is a non-volatile device, is configured so that stored data cannot be read out to the outside of the semiconductor integrated circuit. Also, the semiconductor integrated circuit of FIG. 1 is configured so that the ROM 10 can be tested without impairing the confidentiality of confidential data, such as a microcode, a secret key, a password, or the like. Further, the semiconductor integrated circuit of FIG. 1 is configured so that, when the result of the test shows that an error is detected in the ROM 10, confidential data and check redundant data in which the error is found are encrypted using a predetermined secret key before being output.

In FIG. 1, (n+1) pieces of confidential data (i.e., confidential data (0) to (n)) are stored at lower addresses in the ROM 10. For the confidential data (0) to (n), respective redundant codes (i.e., confidential CRC data (0) to (n) as check redundant data) are generated by CRC (Cyclic Redundancy Check). The confidential CRC data (0) to (n) are stored at upper addresses in the ROM 10 (redundant data storing section).

In an address space of the ROM 10, the confidential data (0) to (n) are stored in order from the lowest address, while the confidential CRC data (0) to (n) are stored in order from the highest address. For example, the confidential CRC data (0) corresponding to the confidential data (0) stored at the lowest address in the ROM 10, is stored at the highest address in the ROM 10. Such an address arrangement is suitable for complementary check on the ROM 10.

Also, in FIG. 1, selectors 21 and 22, an address decoder (ADEC) 23, flip-flops (FFs) 24 and 27, a check computation circuit (CRC) 25, a comparison circuit (COMP) 26, a secret key register 41, an encryption circuit 42, an OR circuit 43, and an inverter 44, constitute a test circuit. A logic circuit block (LOGIC) 30 is a circuit block which is used in a normal mode.

Each of the selectors 21 and 22, when an input S goes to "H" (high level), selects and outputs an input of an input terminal A. The address decoder 23 decodes an address signal which is input during a test, to control the check computation circuit 25, the comparison circuit 26, and the encryption circuit 42. The check computation circuit 25 executes a computation corresponding to a predetermined computation which is executed during generation of confidential CRC data, with respect to confidential data read from the ROM 10. The comparison circuit 26 compares an output of the check computation circuit 25 with confidential CRC data read from the ROM 10.

The OR circuit 43 receives an output of the flip-flop 27 and an output of the flip-flop 24 as inputs, and outputs an OR signal of the inputs to a terminal calc of the encryption circuit 42. The secret key register 41 stores a predetermined secret key, and outputs the secret key to a terminal key of the encryption circuit 42. The encryption circuit 42 encrypts data which is input to an input terminal DIN from the ROM 10, using the secret key input to the terminal key at a rising edge of the signal input to the terminal calc. The result of the encryption is stored into the encryption circuit 42. The encryption circuit 42 also receives, at an enable input en, a signal which is obtained by inverting an output OUT of the comparison circuit 26 in the inverter 44, and outputs the saved encryption result through an output terminal DOUT when the enable input en is asserted ("H"). Note that CLK represents a clock signal for synchronization of each circuit block.

During a normal operation, a test signal TEST is "L" (low level), and the selectors 21 and 22 each select an input of the input terminal B. Specifically, input data through external terminals INA and INB are given to the ROM 10. These pieces of input data are supplied from another block in the semiconductor integrated circuit. An output DO of the ROM 10 is supplied to the logic circuit block 30.

On the other hand, during testing, the test signal TEST is "H", and the selectors 21 and 22 each select an input of the input terminal A. Specifically, input data through external terminals IN1 and IN2 are supplied to an address input ADD and a read input READ of the ROM 10.

Also, the input data through the external terminal IN1 is input to the address decoder 23. When the input data through the external terminal IN1 indicates an address (addresses (0) to (n)) at which confidential data is stored, the address decoder 23 enables an output AOUT1 ("H"). When the output AOUT1 is "H", the check computation circuit 25 succeeding the output DO of the ROM 10 starts an operation with a delay of one clock.

In this case, when the output AOUT1 goes to "H", an input to the terminal calc of the encryption circuit 42 goes to "H", so that the encryption circuit 42 encrypts an input (in this case, confidential data) to the terminal DIN using the secret key input to the terminal key, and holds the result.

When the input data through the external terminal IN1 indicates an address (addresses (n+1) to (2n+1)) at which confidential CRC data is stored, the address decoder 23 enables an output AOUT2 ("H"). When the output AOUT2 goes to "H", the comparison circuit 26 compares the computation result (IN1) of the check computation circuit 25 with the confidential CRC data (IN2) read from the ROM 10. When they match, the output signal RESULT is asserted ("H").

In this case, the input to the terminal calc of the encryption circuit 42 goes to "H" with a delay of one clock, so that the encryption circuit 42 encrypts an input (in this case, confidential CRC data) to the terminal DIN using the secret key input to the terminal key.

When the comparison result of the comparison circuit 26 indicates a mismatch, so that the output signal RESULT is negated ("L"), the enable input en of the encryption circuit 42 is asserted ("H"). In this case, the encryption circuit 42 outputs the encrypted confidential data and confidential CRC data held by itself, through the output terminal DOUT. The signal output through the output terminal DOUT is output via an external terminal EncOUT to the outside of the semiconductor integrated circuit. On the other hand, when the comparison result of the comparison circuit 26 indicates a match, so that the output signal RESULT is asserted ("H"), the enable input en of the encryption circuit 42 is negated ("L"). In this case, the encryption circuit 42 clears the encrypted confidential data and confidential CRC data held by itself.

Figure 2:
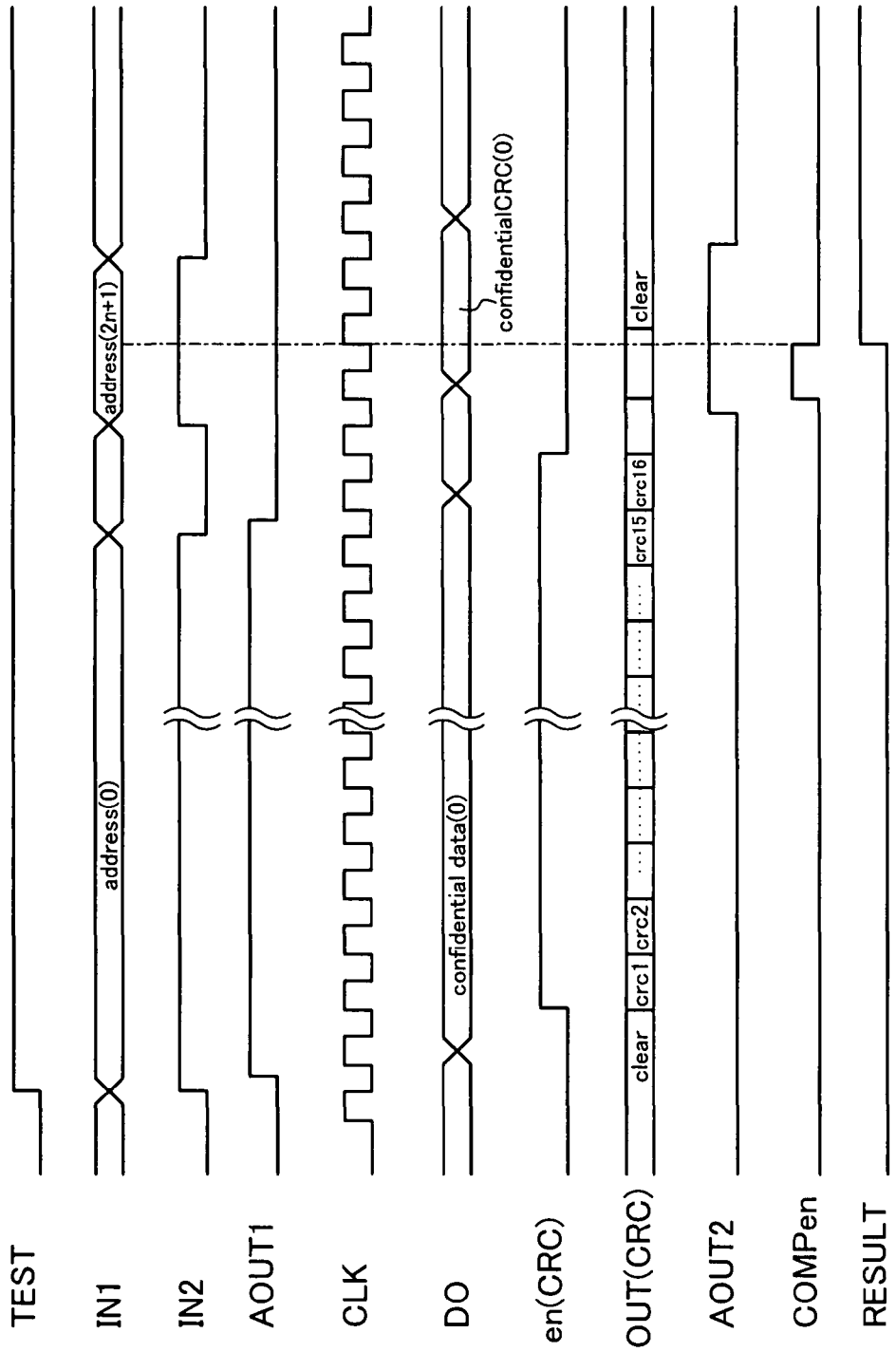
FIG. 2 is a timing chart illustrating an operation during a test on the semiconductor integrated circuit of FIG. 1.

FIG. 2 is a timing chart illustrating an operation during a test on the semiconductor integrated circuit of FIG. 1.

Initially, the test signal TEST is set to be "H" so as to bring the semiconductor integrated circuit into a mode in which the ROM 10 is tested. Next, while a signal indicating the address (0) at which the confidential data (0) is stored in the ROM 10 is input through the external terminal IN1, "H" is input through the external terminal IN2 so as to enable the read input READ of the ROM 10. Thereafter, at the next rising of the clock signal CLK, the confidential data (0) is read out as the output DO of the ROM 10.

Also, since the signal indicating the address (0) is input, the address decoder 23 outputs "H" as the output AOUT1. The signal "H" is latched for one clock by the flip-flop 24 before being supplied as the enable input en to the check computation circuit 25. Thereby, the check computation circuit 25 starts a CRC computation with respect to the confidential data (0) output from the ROM 10. Also, the encryption circuit 42 encrypts the confidential data (0) output from the ROM 10.

The input data to the external terminal IN1 is changed into a value other than the addresses (0) to (n) and the input data to the external terminal IN2 is negated ("L"), one cycle before the check computation circuit 25 completes the CRC computation. In this case, the output AOUT1 of the address decoder 23 is also negated, and the enable input en of the check computation circuit 25 is negated with a delay of one cycle. Thereby, the computation result of the check computation circuit 25 is held at the output OUT.

Next, while a signal indicating the address (2n+1) at which the confidential CRC data (0) corresponding to the confidential data (0) is input through the external terminal IN1, "H" is input through the external terminal IN2 so as to enable the read signal READ of the ROM 10.

Since the signal indicating the address (2n+1) is input, the address decoder 23 outputs "L" as the output AOUT1 and "H" as the output AOUT2. The comparison circuit 26 compares the output OUT of the check computation circuit 25 with the output DO (i.e., the confidential CRC data (0)) of the ROM 10. As the result of the comparison, when they match, the signal RESULT is asserted ("H"), and when they mismatch, the signal RESULT is negated ("L"). Also, the encryption circuit 42 encrypts the confidential CRC data (0) output from the ROM 10. When the signal RESULT is negated ("L") and the enable input en is asserted ("H"), the encryption circuit 42 outputs the encrypted confidential data and confidential CRC data held by itself, through the output terminal DOUT. The signal output through the output terminal DOUT is output via the external terminal EncOUT to the outside of the semiconductor integrated circuit.

When the output AOUT2 is "H", a signal COMPen is asserted for one cycle. The signal COMPen is negated when the signal RESULT is output. The check computation circuit 25 is initialized at falling of the signal COMPen.

Thus, the test of the confidential data (0) is completed.

A similar operation is executed while designating the address (1) and the address (2n), the address (2) and the address (2n−1), . . . , and the address (n) and the address (n+1), thereby externally monitoring the signal RESULT. Based on the result, it can be determined whether or not an abnormality occurs in the ROM 10 due to a problem with manufacture or the like.

When an error is detected by negation of the signal RESULT, the encrypted confidential data and confidential CRC data in which the error has occurred are output through the external terminal EncOUT. In this case, an authorized inspector can use a previously defined secret key to decrypt the encrypted confidential data and confidential CRC data thus output, and compare the result of the decrypting with correct data to be stored in the non-volatile device. Thereby, it is possible to specify a position where the error has occurred.

Even when an illegal user or an unauthorized inspector acquires the encrypted confidential data and confidential CRC data output through the external terminal EncOUT, the user or inspector does not have the secret key and cannot decrypt the data. Therefore, it is possible to prevent leakage of the confidential data.

Note that, in the configuration of FIG. 1, the secret key used in the encryption circuit 42 is assumed to be a predetermined value stored in the secret key register 41. Alternatively, the secret key stored in the secret key register 41 may be updated as appropriate. Thereby, the confidentiality of the output data can be improved.

Figure 3:
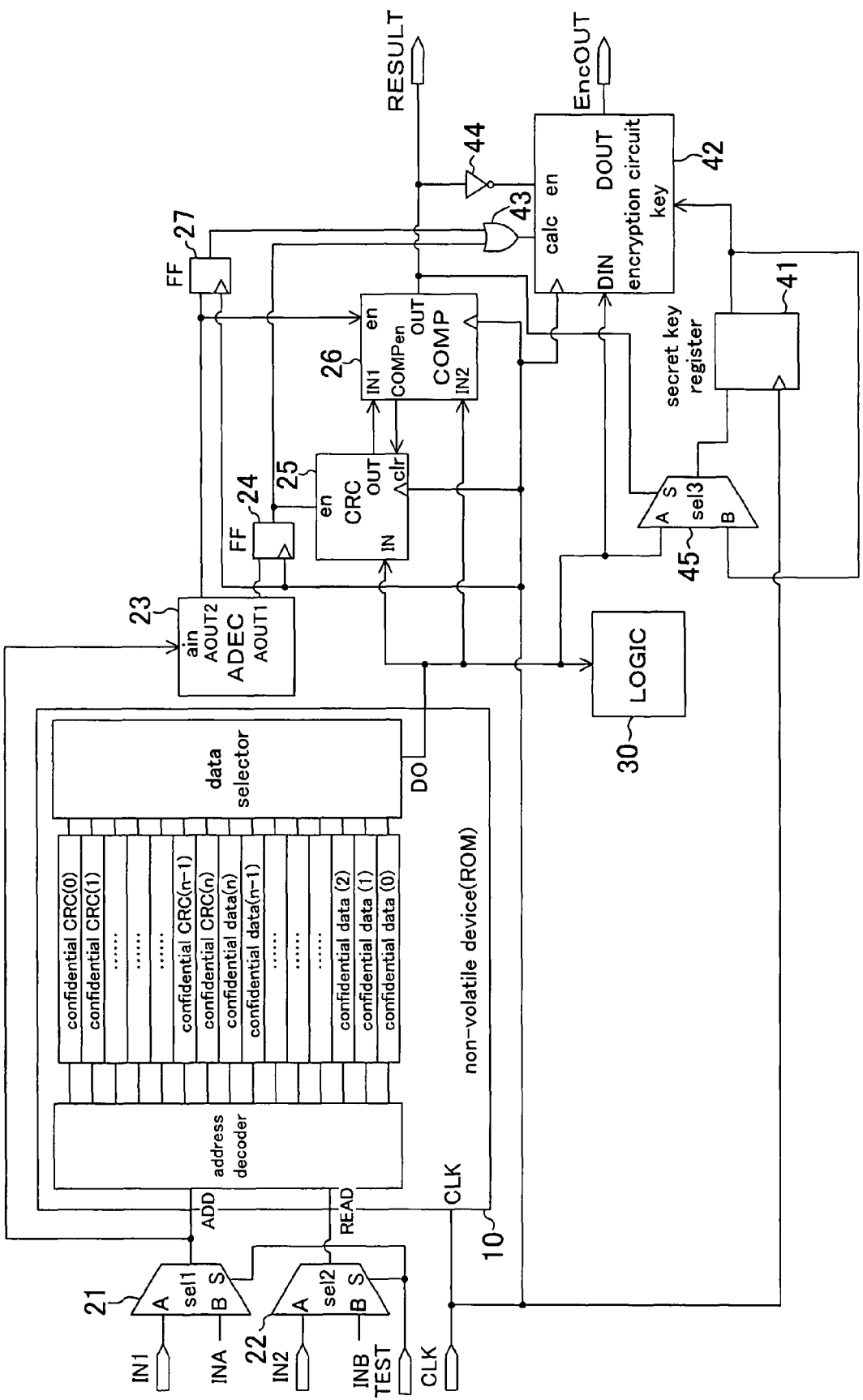
FIG. 3 is a block diagram illustrating a configuration of a semiconductor integrated circuit according to a variation of the embodiment of the present invention.

For example, in a configuration of FIG. 3, a selector 45 is added which receives the output DO of the ROM 10 and a value stored in the secret key register 41 as inputs, and supplies an output selected depending on the output signal RESULT to the secret key register 41. The selector 45 stores the output DO (i.e., confidential CRC data) of the ROM 10 into the secret key register 41 when the output signal RESULT is asserted ("H"), i.e., the comparison circuit 26 detects a match between the computation result and the confidential CRC data. Thereby, the secret key stored in the secret key register 41 is updated. Note that, when the output signal RESULT is negated ("L"), the selector 45 selects the output of the secret key register 41, and therefore, the value of the secret key register 41 is not updated. Thereby, a constant secret key is not used, and a secret key used in encryption of confidential data and check redundant data varies depending on the position of occurrence of an error, thereby making it possible to improve the confidentiality.

Note that, assuming that the value of confidential CRC data is saved into the secret key register 41, when the confidential CRC data and the secret key have different bit lengths, an appropriate computation is executed with respect to the confidential CRC data so that the confidential CRC data has the same bit length as that of the secret key. The appropriate computation may be a hash computation (e.g., SHA-1, etc.), a method of using a designated number of bits from the head of confidential CRC data, or a method of using a transposition table or the like.

In this case, a predetermined initial value is preferably provided in the secret key register 41. Thereby, when an error is found during the start of testing, a secret key used in encryption of output data can be specified.

Although a non-volatile device for storing confidential information is assumed to be a ROM in this embodiment, another non-volatile device, such as a Fuse or the like, may be used.

Any technique for common key encryption, such as DES, AES, Multi2, Triple DES, or the like, may be used for encryption executed in the encryption circuit 42.

In this embodiment, when an error is found, both confidential data and confidential CRC data are encrypted and output. Alternatively, only confidential data may be encrypted and output. To this end, for example, the OR circuit 43 may be removed from the configuration of FIG. 1, and only the output of the flip-flop 24 may be input to the terminal calc of the encryption circuit 42. In this case, it is possible to confirm whether or not there is an error in confidential data. When there is not an error, it can be confirmed that the detected error does not have a problem with the function of the semiconductor integrated circuit.

Figure 4:
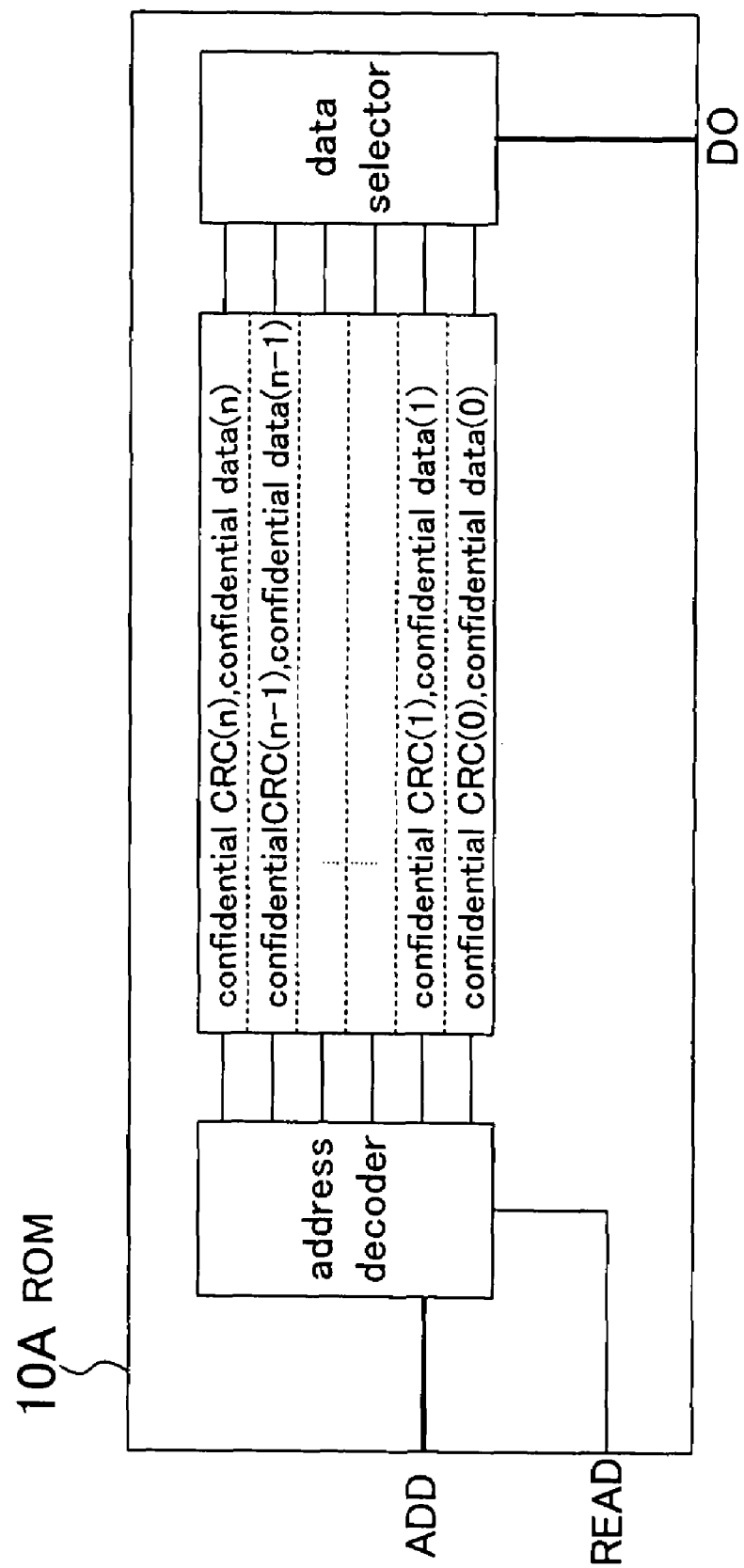
FIG. 4 is a diagram illustrating another example of data storage in a ROM.

In the configuration of FIG. 1, confidential CRC data and confidential data are stored at different addresses. Alternatively, confidential CRC data and confidential data may be stored at the same address. For example, as illustrated in FIG. 4, confidential CRC data may be mapped to an upper bit position of corresponding confidential data.

Also in the configuration of FIG. 1, confidential CRC data is stored in a ROM itself in which confidential data is stored. Alternatively, confidential CRC data may be stored in a storage section, but is a ROM in which confidential data is stored, such as a ROM which is embedded in a semiconductor integrated circuit, or the like.

When the content of confidential data is changed, only confidential CRC data need be changed, depending on the change in the confidential data. Therefore, the change of the configuration of the test circuit is not required, and therefore, the number of steps during development, the cost of designing a mask, or the like can be significantly reduced.

Data other than redundant codes by CRC may be used to check confidential data. Note that, in this case, a check computation circuit for executing a computation corresponding to a predetermined computation for generating the check data, needs to be provided in a test circuit.

Although a synchronous ROM has been described as an example in this embodiment, a similar embodiment may be readily achieved using an asynchronous ROM.

In the present invention, it is possible to specify a position of occurrence of an error without impairing the confidentiality of confidential data in a non-volatile device. Therefore, the present invention is useful for efficient analysis of a cause of an error in a test on a non-volatile device included in a semiconductor integrated circuit.

What is claimed is:

1. A semiconductor integrated circuit including a non-volatile device for storing confidential data, wherein
   the non-volatile device is configured so that stored data cannot be read out to the outside of the semiconductor integrated circuit,
   the semiconductor integrated circuit comprises:
   a redundant data storing section for storing check redundant data obtained by subjecting the confidential data to a predetermined computation; and
   a test circuit for executing a test on the non-volatile device using the check redundant data stored in the redundant data storing section,
   the test circuit comprises:
   a check computation circuit for executing a computation corresponding to the predetermined computation with respect to the confidential data read from the non-volatile device;
   a comparison circuit for comparing a result of the computation in the check computation circuit with the check redundant data stored in the redundant data storing section; and
   an encryption circuit for encrypting the confidential data and the check redundant data using a predetermined secret key, and
   when a mismatch between the computation result and the check redundant data is detected as a result of the comparison in the comparison circuit, a result of the encryption in the encryption circuit is output to the outside of the semiconductor integrated circuit,
   wherein only when the encryption circuit receives a signal indicating mismatch from the comparison circuit, the encryption circuit outputs an encrypted data corresponding a portion of mismatch between the computation result and the check redundant data.

2. The semiconductor integrated circuit of claim 1, wherein the redundant data storing section is the non-volatile device.

3. The semiconductor integrated circuit of claim 2, wherein the check redundant data is stored at addresses different from those of the confidential data in the non-volatile device.

4. The semiconductor integrated circuit of claim 2, wherein the check redundant data is stored at the same addresses as those of the confidential data in the non-volatile device.

5. The semiconductor integrated circuit of claim 1, wherein the encryption circuit encrypts only the confidential data using the predetermined secret key.

6. The semiconductor integrated circuit of claim 1, wherein the test circuit further comprises a secret key register for storing the predetermined secret key.

7. The semiconductor integrated circuit of claim 6, wherein the test circuit updates the predetermined secret key stored in the secret key register based on the check redundant data when a match between the computation result and the check redundant data is detected in the comparison circuit.

8. The semiconductor integrated circuit of claim 7, wherein a predetermined initial value is provided in the secret key register.

9. A method for testing a semiconductor integrated circuit including a non-volatile device for storing confidential data, wherein
   the non-volatile device is configured so that stored data cannot be read out to the outside of the semiconductor integrated circuit,
   the method comprises the steps of:
   previously storing check redundant data obtained by subjecting the confidential data to a predetermined computation into a redundant data storing section in the semiconductor integrated circuit;
   reading the confidential data from the non-volatile device, and executing a computation corresponding to the predetermined computation with respect to the read confidential data;

reading the check redundant data from the redundant data storing section, and comparing a result of the computation with the read check redundant data; and encrypting the confidential data and the check redundant data using a predetermined secret key when a mismatch between the computation result and the check redundant data is detected as a result of the comparison.

10. A semiconductor integrated circuit including a non-volatile device for storing confidential data, wherein the non-volatile device is configured so that stored data cannot be read out to the outside of the semiconductor integrated circuit, the semiconductor integrated circuit comprises:

a redundant data storing section for storing check redundant data obtained by subjecting the confidential data to a predetermined computation; and a test circuit for executing a test on the non-volatile device using the check redundant data stored in the redundant data storing section, the test circuit comprises:

a check computation circuit for executing a computation corresponding to the predetermined computation with respect to the confidential data read from the non-volatile device;

a comparison circuit for comparing a result of the computation in the check computation circuit with the check redundant data stored in the redundant data storing section; and an encryption circuit for encrypting the confidential data and the check redundant data using a predetermined secret key, and when a mismatch between the computation result and the check redundant data is detected as a result of the comparison in the comparison circuit, a result of the encryption in the encryption circuit is output to the outside of the semiconductor integrated circuit, wherein the test circuit further comprises a secret key register for storing the predetermined secret key, and wherein the test circuit updates the predetermined secret key stored in the secret key register based on the check redundant data when a match between the computation result and the check redundant data is detected in the comparison circuit.

11. The semiconductor integrated circuit of claim 10, wherein a predetermined initial value is provided in the secret key register.

* * * * *